US007251459B2

(12) United States Patent
McFarland et al.

(10) Patent No.: US 7,251,459 B2
(45) Date of Patent: Jul. 31, 2007

(54) DUAL FREQUENCY BAND WIRELESS LAN

(75) Inventors: William J. McFarland, Los Altos, CA (US); Keith Onedera, Berkeley, CA (US); Arie Shor, Sunnyvale, CA (US); David Su, Mountain View, CA (US); Manolis Terrovitis, Berkeley, CA (US); John Thomson, Union City, CA (US); Masoud Zaragari, Cupertino, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 640 days.

(21) Appl. No.: 10/139,137

(22) Filed: May 3, 2002

(65) Prior Publication Data

US 2003/0207668 A1 Nov. 6, 2003

(51) Int. Cl.
    *H03C 7/02* (2006.01)
(52) U.S. Cl. .................... 455/101; 455/132; 455/553.1
(58) Field of Classification Search ............... 455/73, 455/76, 78, 83, 84, 86, 101, 132, 133, 137, 455/269, 272, 273, 266, 324, 127.2, 127.4, 455/340, 552.1, 553.1, 255, 260, 264; 375/219; 370/276, 277, 278; 331/2, 10, 16
    See application file for complete search history.

(56) References Cited

U.S. PATENT DOCUMENTS

| | | | |
|---|---|---|---|
| 5,475,875 A | | 12/1995 | Katsuyama et al. |
| 5,842,122 A | * | 11/1998 | Schellinger et al. ........ 455/403 |
| 6,526,034 B1 | * | 2/2003 | Gorsuch ...................... 370/338 |
| 6,560,443 B1 | * | 5/2003 | Vaisanen et al. .............. 455/73 |
| 6,609,010 B1 | * | 8/2003 | Dolle et al. ............... 455/552.1 |
| 6,728,517 B2 | * | 4/2004 | Sugar et al. ................... 455/73 |
| 6,865,381 B2 | * | 3/2005 | Vorenkamp et al. ........ 455/307 |

(Continued)

FOREIGN PATENT DOCUMENTS

EP 0 865 588 9/1998

(Continued)

OTHER PUBLICATIONS

Sugar et al., U.S. Appl. No. 60/376,722, filed Apr. 29, 2002 (pp. 1-7).*

(Continued)

*Primary Examiner*—Duc M. Nguyen
*Assistant Examiner*—Anthony S. Addy
(74) *Attorney, Agent, or Firm*—Bever, Hoffman & Harms, LLP; Jeanette S. Harms

(57) ABSTRACT

A dual band radio is constructed using a primary and secondary transceiver. The primary transceiver is a complete radio that is operational in a stand alone configuration. The secondary transceiver is a not a complete radio and is configured to re-use components such as fine gain control and fine frequency stepping of the primary transceiver to produce operational frequencies of the secondary transceiver. The primary transceiver acts like an intermediate frequency device for the secondary transceiver. Switches are utilized to divert signals to/from the primary transceiver from/to the secondary transceiver. The switches are also configured to act as gain control devices. Antennas are selected using either wideband or narrowband antenna switches that are configured as a diode bridge having high impedance at operational frequencies on control lines that bias the diodes.

94 Claims, 6 Drawing Sheets

U.S. PATENT DOCUMENTS

| | | | |
|---|---|---|---|
| 6,895,255 B1* | 5/2005 | Bridgelall | 455/552.1 |
| 7,020,472 B2* | 3/2006 | Schmidt | 455/450 |
| 2002/0003586 A1 | 1/2002 | Yamamoto | |
| 2002/0025778 A1* | 2/2002 | Lee | 455/3.05 |
| 2003/0060195 A1* | 3/2003 | Dent | 455/426 |
| 2003/0119466 A1* | 6/2003 | Goldman | 455/260 |
| 2003/0124982 A1* | 7/2003 | Saari et al. | 455/67.4 |
| 2004/0152418 A1* | 8/2004 | Shnha et al. | 455/42 |
| 2004/0204036 A1* | 10/2004 | Yang | 455/553.1 |
| 2004/0205820 A1* | 10/2004 | Khoini-Poorfard et al. | 725/68 |
| 2004/0205827 A1* | 10/2004 | Krone | 725/131 |
| 2004/0259518 A1* | 12/2004 | Aktas et al. | 455/323 |
| 2005/0020298 A1* | 1/2005 | Masumoto et al. | 455/552.1 |
| 2005/0255878 A1* | 11/2005 | Leinonen et al. | 455/552.1 |

FOREIGN PATENT DOCUMENTS

| | | |
|---|---|---|
| EP | 1 041 770 | 10/2000 |
| EP | 1 124 337 | 8/2001 |
| EP | 1 176 709 | 1/2002 |
| JP | 08 228165 | 9/1996 |
| JP | 11 274972 | 10/1999 |
| WO | WO 00/39943 | 7/2000 |
| WO | WO 02/31999 | 4/2002 |

OTHER PUBLICATIONS

Sugar et al., U.S. Appl. No. 60/374,531, filed Apr. 22, 2002 (pp. 1-14).*

International Search Report dated Jan. 23, 2004.

Business Wire in Association With The Gale Group and Looksmart, *RF Solutions Introduces Dual-band Transceiver*, Dec. 18, 2001.

Semiconductor Business News, *RF Solutions, Ellipsis to develop wireless LAN chip sets for multiple standards*, Feb. 26, 2002.

Razavl, Behzad, *A 900-MH-z/1.8-GHz CMOS Transmitter for Dual-Band Applications*, IEEE Journal of Solid-State Circuits, vol. 34, No. 5, May 1999, pp. 573-579.

* cited by examiner

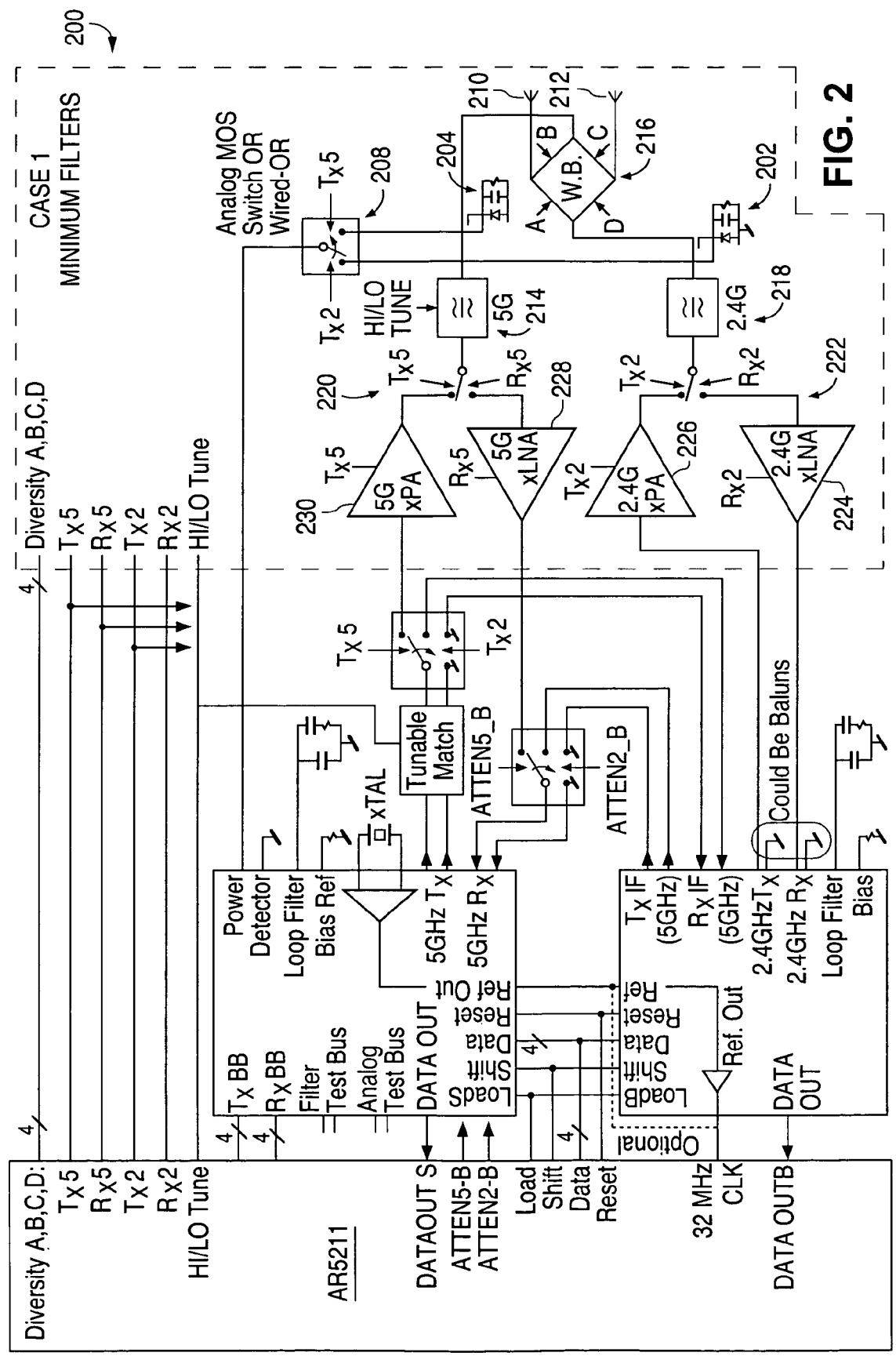

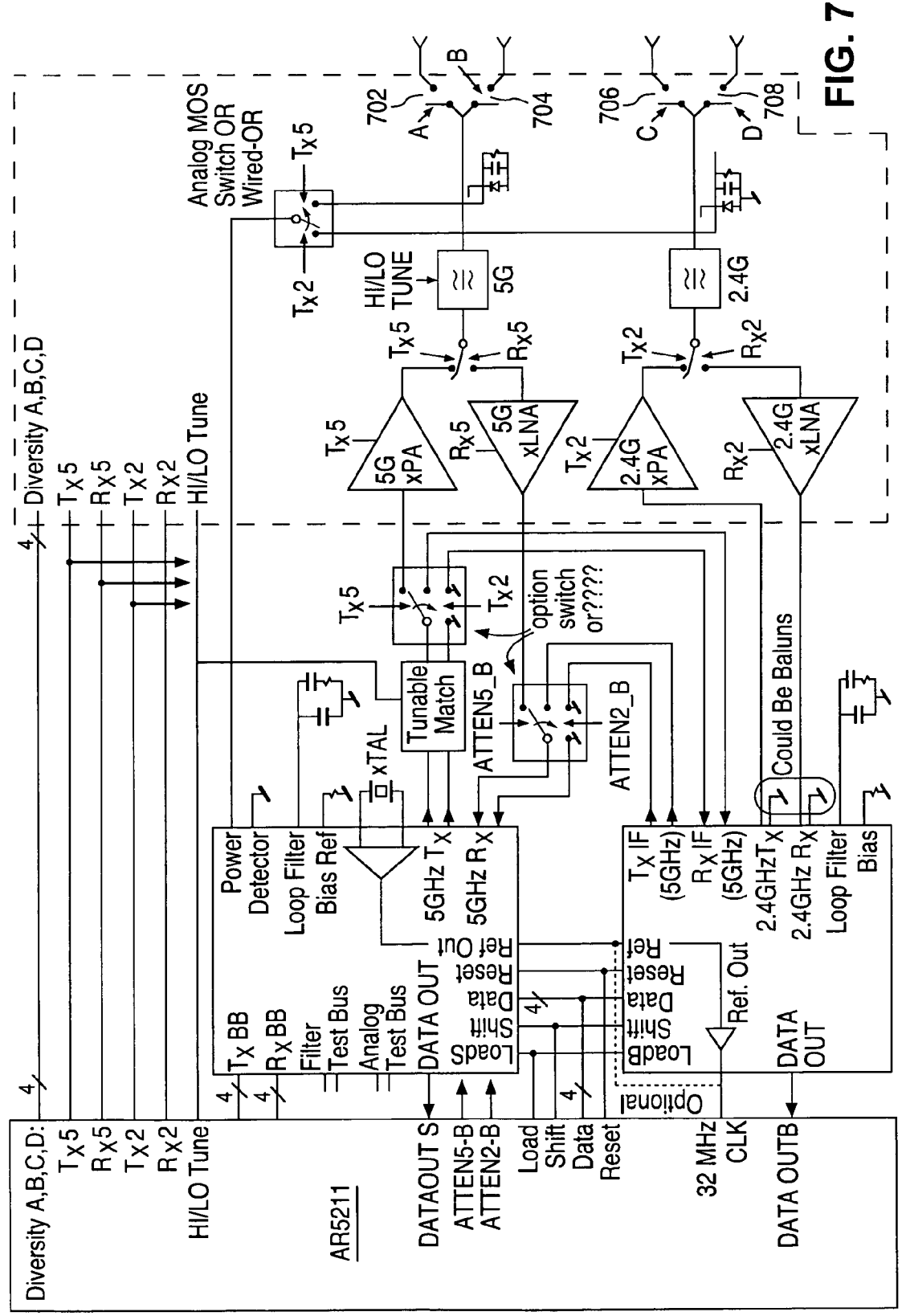

DUAL FREQUENCY BAND WIRELESS LAN

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates to wireless devices and access systems, and amongst other things to a dual frequency wireless LAN device and techniques for constructing the wireless LAN device.

2. Discussion of Background

Multi-band radios are available in a number of industries. In particular, the cell phone industry has utilized dual band and tri-band radios for a number of years. For example, Motorola's StarTac and Qualcomm's 2760 operate on at least two different frequency bands and/or formats.

Currently there are two particularly popular standards for wireless local area networking ("WLAN"): IEEE 802.11a and 802.11b. Devices compliant with the 802.11b standard operate in the 2.4 GHz band using direct sequence spread spectrum ("DSSS") and complementary code keying ("CCK") modulation. 802.11a operates in the 5 GHz band using orthogonal frequency division multiplexing ("OFDM") modulation.

Currently, for wireless LAN, the only multi-frequency solutions require two completely separate transceivers derived from two completely separate chipsets. This increases the size and cost of the solution. In addition, some providers have announced plans to develop fully integrated one- or two-chip based systems in which both frequency bands and modes of operation are built in. However, since such integrated solutions require the development of completely new silicon for all modes of operation, the development of these chipsets is slow and expensive. In addition, if a manufacturer decides they want only single band operation, they must still pay for all the silicon area of a dual band approach if both frequency bands are implemented on one chip.

SUMMARY OF THE INVENTION

The present inventors have realized the need for an integrated, low cost wireless LAN solution that can accommodate a plurality of modes of operation. The present invention provides a dual band transceiver that is constructed without the need for two independent and complete transceiver systems, while also providing the option of single band operation and cost savings. Various implementations of chipsets for both radios and supporting circuitry are provided on a PC board (or otherwise integrated into other components) that allow the construction of a dual mode, dual band wireless WLAN solution.

The present invention includes an approach to dual band design that is neither in two complete and independent radio systems, nor does it require entirely new development. The present invention utilizes some existing radio components in a new way that reduces additional design work to produce a new product. The preferred embodiment of the present invention includes a 5 GHz OFDM design modified by the addition of a uniquely arranged frequency conversion stage that supports 2.4 GHz operation. The result is rapid time to market with a solution that is lower cost and size than an approach using two independent chipsets.

In one embodiment, the present invention provides a wireless LAN device having a dual band RF capability. The wireless LAN device is preferably constructed using a primary transceiver and a secondary transceiver. Preferably, the primary transceiver comprises a first RF communication device, and the secondary transceiver comprises a partial RF communication device that utilizes features of the primary transceiver to be able to perform as a second RF communication device.

In another embodiment the present invention is a dual band capable wireless device, comprising, a primary transceiver configured to operate in a primary frequency band, and a set of hardware connections configured to accept a secondary transceiver, wherein at least one of such connections converts signals emanating from the primary transceiver to a second frequency band, and converts received signals of the second frequency band to the primary frequency band and forwards the converted primary frequency band signals to the primary transceiver.

In another embodiment, the present invention includes a method of performing WLAN communications with a dual band WLAN device, comprising the steps of, listening for primary communication signals in a primary frequency band, and initiating WLAN operations in the primary frequency band if a WLAN transmission is detected in the primary frequency band.

Portions of both the inventive device and method may be conveniently implemented in programming on a general purpose computer, or microprocessor. In addition, any components of the present invention represented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), and co-ax cable(s), etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a circuit diagram of a detailed version of an embodiment of the dual band radio that follows from the top level design of FIG. 1;

FIG. 7 is a circuit diagram of an embodiment of independent antenna selection switches according to the present invention.

DESCRIPTION OF THE PREFERRED EMBODIMENTS

Figure 1:
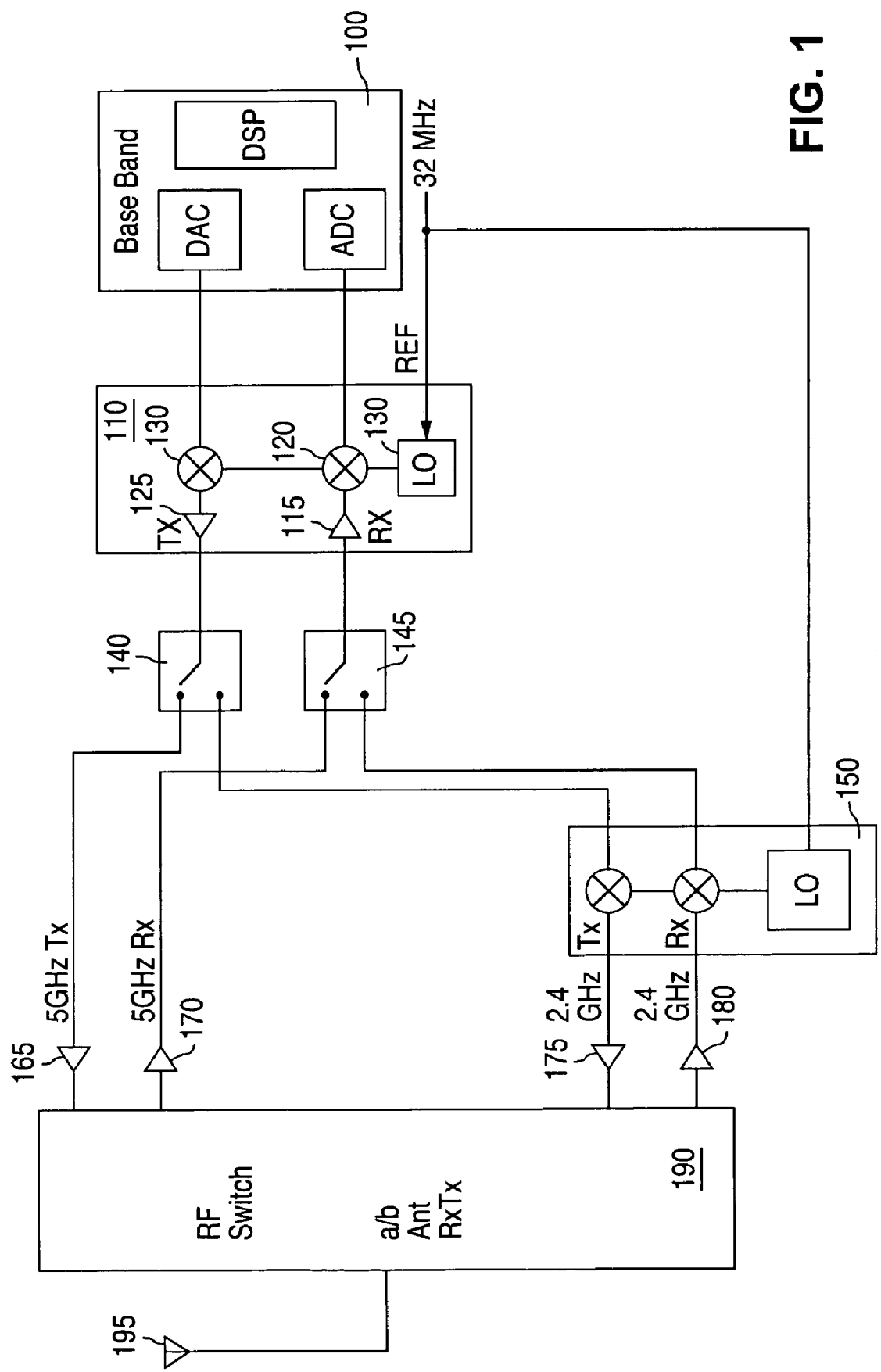
FIG. 1 is a top level block diagram of a dual band radio according to an embodiment of the present invention.

Referring now to the drawings, wherein like reference numerals designate identical or corresponding parts, and more particularly to FIG. 1 thereof, there is illustrated a top level block diagram of a dual band transceiver according to an embodiment of the present invention. A base band processor 100 processes signals that are to be broadcast and signals that are received. A first RF device 110 converts signals that are to be broadcast to a first RF frequency band. In a preferred embodiment, the first RF frequency band is the 5 GHz frequency band, and the first RF device 110 is a radio on a chip (e.g., the AR5111 chip from Atheros Communications, Inc., assignee of the present invention). However, other 5 GHz (or other first RF frequency) chip sets or discrete components may be utilized.

Switch 140 routes the first RF frequency band signals to RF circuitry including PA 165, switches (e.g. 11a/11b (also called "a/b" herein) antenna switch, and RxTx switch) 190, and on-chip filters (as needed per individual design). After amplification and antenna selection, the first RF frequency band signals are sent to antenna 195 for transmission in the first RF frequency band. Alternatively, switch 140 routes the baseband converted signals to a frequency converter (preferably a 2.4 GHz chip which converts the preferred 5 GHz signal to the 2.4 GHz band, e.g., an Atheros AR2111 IEEE 802.11b radio device) 150. Signals from frequency converter 150 are connected to a 2.4 GHz portion of the RF circuitry including PA 175, switches (e.g., 11a/11b antenna switch, and RxTx switch) 190 and on-chip filters (as needed per individual design), and then broadcast on antenna 195 (antenna 195 may comprise several antennas selected from switches 190, or may be a multi band antenna).

Incoming signals are received by antenna 195 and fed into an appropriate low noise amplifier ("LNA") device 170 or 180 and then either directly to the first RF device 110, or to frequency converter 150 and then to the first RF device 110. For example, when in a 5 GHz mode, signals received on the antenna 195 are directed to 5 GHz LNA 170 by a/b antenna and RxTx switches 190 and then directed by switch 145 to an RX amplifier 115 and mixer 120 of the first RF device 110. The first RF device 110 converts the received signals to baseband frequency where the baseband device 100 performs an analog to digital conversion (ADC). The digital signals are then processed according to programming of the Digital Signal Processor ("DSP") of the baseband device 100. When in 2.4 GHz mode, signals received on the antenna 195 are directed to 2.4 GHz LNA 180 by a/b antenna and RxTx switches 190 and then fed directly into frequency converter 150. The frequency converter up converts the 2.4 GHz signals to a 5 GHz signal which is directed to first RF device 110 by switch 145.

The architecture described in FIG. 1, in which signals to be broadcast are first converted to 5 GHz and then optionally converted to 2.4 GHz when desired has several advantages over other approaches. First, the 5 GHz signal path is kept very clean. There are no unnecessary frequency conversions or circuitry in th higher frequency path other than components required to divert the signal as needed for frequency conversion. Also, by providing the different frequency stages in separate circuit blocks (5 GHz on 110 and 2.4 GHz on 150) as shown, there is no extra circuitry to perturb or complicate the routing of signals in the 5 GHz conversion block. Here, isolation of the 5 GHz path is particularly important since OFDM modulation used in that band can be much more easily corrupted than the DSSS and CCK modulations used in the 2.4 GHz band. It should be noted that, while isolation is beneficial, combination of the two frequency blocks on a single chip would make also have cost benefits while clearly falling within the scope of the present invention.

Another advantage of this architecture is that an 802.11a (5 GHz) only solution can be created at the lowest possible cost with a subset of the same chipset. A 5 GHz only solution can be built by eliminating the frequency converter 150 (also referred to herein as the AR2111, but may be any appropriately configured device, preferably a 2.4 GHz to 5 GHz and visa versa design) and all of its associated 2.4 GHz components. Because the first RF device 110 (also referred to herein as the AR5111, but may be any appropriately configured radio solution, preferably a 5 GHz solution) has only the 5 GHz circuitry on it, it can be created with a minimum die size and cost. A further benefit is that customers can build dual band and 5 GHz only solutions from the same chipset, with the same printed circuit boards, by simply leaving off the AR2111 and associated 2.4 GHz circuitry from the 5 GHz boards. Similar benefits could be obtained if the frequencies of the two chips is reversed. In that case, the 2.4 GHz radio would be a less expensive subset of the complete radio which would provide operation at both 2.4 and 5 GHz.

Yet another advantage of this approach is the ability to base a dual band design on an existing single band chip or chipset. Manufacturers may have already designed, tested, and put into production products based on a single band only. In that case, by the addition of a chip that converts, for example, 5 GHz to 2.4 GHz, a dual band solution can be created with minimum risk and change to the existing solution.

The more traditional approach of converting directly from the baseband to each of the two bands (rather than the sequential conversion shown) does not provide the above-described advantages.

FIG. 1 shows a switch (switches 140 and 145) between the AR5111 110 and AR2111 150 that is used to select whether the signals are routed between the two chips, or routed to/from the 5 GHz front end RF circuitry. This switch provides a number of advantages.

First, the switch insures the efficient transfer of power from and to the desired destination. Without the switch, using direct connections, wiring the output of the AR5111 110 to both the 5 GHz front end and the AR2111 150 (e.g., a printed signal splitter), power would be wasted driving loads that are not active (since, in a preferred embodiment, only one of the 5 GHz front end and AR2111 150 are active at any given time), which is similar to driving a termination on the line not being used. Since power is very valuable, particularly at high frequencies, the savings due to the efficiency provided by the switch are substantial.

In addition the switches (140 and 145) can be opened and shut as part of a transmit or receive gain control algorithm. The switches 140 and 145 can be closed in positions that either direct signals between the AR5111 and AR2111, or to/from the AR5111 and the 5 GHz front end (e.g., PA 165 and LNA 170). In addition, the switches preferably offer a third position (not shown) that is open (not connected to either the AR2111 or the 5 GHz front end). In theory, an open switch does not allow any signal to pass. However, in practice, and particularly at frequencies like 5 GHz, in the third or neutral position, some of the signal will leak around the open switch. That leakage then becomes the attenuated signal (the leaked signal appears as the signal having attenuation applied to it). A similar result can be achieved having the switch select the inactive input, as the signal on the active input will still leak through the switch and appear attenuated at the output.

The present invention takes advantage of leakage around open switches to produce an attenuated signal. Attenuation from open switches built for 5 GHz operations are in the range of 5-15 dB, which is then used as attenuation step sizes to help in the control of the transmit and receive signal sizes. Another aspect of attenuation performed by switching subsystem of the present invention is that the switches opened for attenuation are the same switches used to direct signals between the 5 GHz and 2.4 GHz chips and the 5 GHz chip and 5 GHz radio front end. For example, a strong incoming 5 GHz signal that may saturate the receive ("RX") amp 115 could be attenuated by 5-15 dB by opening switch 145 to the neutral third position, or connecting it to the opposite input from the desired signal.

Attenuation of incoming signals is particularly important in the wireless LAN environment where regulatory requirements often include an admonition to receive all potential interferers, and incoming signal strengths vary widely. Signal strength at a base station from a remote client device will often vary depending on the distance between the base station and client device. The client device may be mobile and the received signals' strengths could be constantly changing from very high signal strengths to very low signal strengths. When communication is performed at a large distance (e.g., near the operational limits of the wireless device), the communications signal from the distant transmitter (such as a notebook computer, often referred to as a "client") to the receiver (perhaps a wireless access point ("AP") connected to a wired network) is typically very small, possibly requiring all the available gain from LNA 170 and RX amplifier 115. Conversely, the client device may be very close to the AP (e.g., within 2 or 3 feet), and the communications signal would carry a greater amount of power, quite possibly saturating any of the components in the receive signal path. In this saturation case, the switch 145 is opened to attenuate the signal to help prevent saturation of the RX amplifier 115 and/or the ADC of baseband 100. In another example, the switch may be used to at least partially attenuate very strong blocker signals, such as nearby military radar devices, the signals of which must be sensed, recognized and then avoided by WLAN devices in their vicinity.

Another advantage of switch based attenuation is that the switch can be operated at high speed (switching speeds). Furthermore, the switches do not require settling time that is generally required for turning on or off power amplifiers or LNAs. Since switching speed is much faster than turning on or off LNAs and power amplifiers ("Pas"), switch based attenuation has a responsiveness advantage over other gain control mechanisms.

Therefore, a weak signal would be coupled to the AR 5111 with a direct connection of switch 145, while a strong signal would be coupled via leakage around switch 145 in an open position. In one embodiment, in some cases, if the signal is very strong, the switch 145 is placed in the opposite position. For example, with a very strong incoming 5 GHz signal (for example, the military radar example described above), switch 145 is placed in a closed position directly coupling the AR2111 to the AR5111. However, signal leakage from the 5 GHz Rx line onto lines connected to RX amplifier 115 may, depending on the received signal strength, be sufficient to provide a properly sized signal to the AR5111 110.

The preferred embodiment of the present invention is not intended to perform simultaneous dual band communications. Therefore, the architecture(s) discussed herein are not intended to allow both signal frequencies (2.4 GHz and 5 GHz) to be transmitted or received at the same time or have the same signal frequency both transmitted and received at the same time. The architecture works from the premise that either the radio is transmitting or receiving at 5 GHz or 2.4 GHz, but not both at the same time. Preferably, it is the client device that decides which signals it will communicate on by first listening for WLAN traffic or signal beacons and then deciding which frequency is available or optimal to connect to a network. For example, the client device first listens for a 5 GHz network, and, if an appropriate 5 GHz network is not available, then it listens for an appropriate 2.4 GHz network. As soon as an appropriate network is found, the client device connects to it and preferably remains on that frequency as long as the performance of the channel meets certain minimum standards. Switching between 5 GHz and 2.4 GHz may be accomplished, but only at a relatively low switching speed, and generally only when searching for a new network to connect with. Therefore a device having the presently preferred architecture, once connected to a network at 5 GHz, would not have any interest in what is occurring in the 2.4 GHz band. In fact, the 2.4 GHz circuitry shown in FIG. 1 would preferably not even be powered on. Since the 2.4 GHz circuitry is powered down, when receiving very strong 5 GHz signals and switch 145 is placed in a closed position directly coupling the AR2111 150 to the AR5111 110, the leakage (attenuated 5 GHz signal) is not substantially affected by any 2.4 GHz signals that might be in the same airspace and might otherwise be picked up and forwarded to the AR5111.

Another feature that can be observed in the diagram of FIG. 1 is that no off-chip filtering is added between the two radio devices. Because the two frequency bands are widely separated in frequency (2.4 GHz vs. 5 GHz), the mixing images caused by the Local Oscillator ("LO") (which could also be a Phase Locked Loop (PLL), or synthesizer) of the conversion to/from 2.4 GHz can be easily removed to a sufficient degree even with very broad filtering that can be provided in the active circuits on the chip.

Table 1 shows samples of LO frequencies within each of the chips to achieve different 2.4 GHz channel frequencies.

TABLE 1

| 11b RF out (AR2111) | 11b LO (AR2111) | (AR5111) RF |
|---|---|---|
| 2.412 GHz | 3.168 GHz | 5.58 GHz |
| 2.417 GHz | 3.168 GHz | 5.585 GHz |
| 2.422 GHz | 3.168 GHz | 5.590 GHz |
| 2.427 GHz | 3.168 GHz | 5.595 GHz |
| 2.432 GHz | 3.168 GHz | 5.600 GHz |
| 2.437 GHz | 3.168 GHz | 5.605 GHz |
| 2.442 GHz | 3.168 GHz | 5.610 GHz |
| 2.447 GHz | 3.168 GHz | 5.615 GHz |
| 2.452 GHz | 3.168 GHz | 5.620 GHz |
| 2.457 GHz | 3.168 GHz | 5.625 GHz |
| 2.462 GHz | 3.168 GHz | 5.630 GHz |
| 2.467 GHz | 3.168 GHz | 5.635 GHz |
| 2.472 GHz | 3.168 GHz | 5.64 GHz |
| 2.484 GHz | 3.136 GHz | 5.62 GHz |

In each row of Table 1 there is provided an AR5111 frequency (e.g., 5.58) that is the output frequency of the AR5111, and is also the frequency at which broadcasts emanating from a device configured according to FIG. 1 are made in the case where the device is connected to a 5 GHz IEEE 802.11a network. Also listed is an AR2111 LO frequency which is the frequency at which the LO of the AR2111 operates when the AR2111 is in operation (e.g., when the device is connected to a 2.4 GHz or IEEE 802.11b network)(3.168 GHz). The 11b RF out signal is the difference between the AR5111 broadcast frequency and the AR2111 LO frequency (e.g., 5.58 GHz–3.168 GHz=2.412 GHz).

In general, under the IEEE 802.11a standard, channel steps are made in 20 MHz increments. And, under 802.11b, the channel steps are made in 5 MHz steps—smaller steps than are required in 802.11a. Preferably, the LO on the AR2111 remains fixed, and the LO on the AR5111 changes frequency to select the correct 2.4 GHz channel. To accomplish this, the AR5111 takes a 32 MHz reference signal and forms smaller steps required. Methods for forming the appropriate size frequency steps from a 32 MHz reference are well known to those skilled in the art.

The arrangement so described has the advantage that only one LO needs to be able to make the smaller channel steps (5 MHz) required for the 802.11a and 802.11b standards. The LO on the AR2111 can make no steps at all, or can have a single large step (a 32 MHz step is shown). The single large step is needed in order to hit one unusual frequency that is required by 802.11 for operation under Japanese regulations (last row in Table 1). Local oscillators that have no frequency steps, or only large ones that are a multiple of the reference frequency, are easier to design and can have lower phase noise for a given power dissipation than LOs with fine frequency steps. This architecture requires only one fine stepping LO (or PLL or synthesizer).

Another feature of the two LOs is that both are run from the same reference frequency (32 MHz in this example). It can be seen in Table 1 that all of the "11b LO" frequencies generated by the LO on the AR2111 are multiples of 32 MHz and can therefore be developed in the straightforward way known to those skilled in the art to which the present invention pertains.

Another point of novelty of the inventive architecture is how gain control is achieved on both transmit and receive. In receive, the gain must be adjusted so that the incoming signal arrives at the analog to digital converters ("ADCs") with the proper magnitude. In order to best use the ADC range, minimizing noise while not distorting the signal, this gain must be set so that the signal input to the ADC is within a few dB range (~3 dB) of a target signal size (e.g., target signal size being a signal that is sized below a signal size that would cause ADC clipping, but well above the resolution of the smallest ADC step).

In the preferred architecture, the fine gain receive gain control is implemented only on the AR5111 (5 GHz chip). When receiving at 2.4 GHz, only coarse gain steps are made in the AR2111. This approach is advantageous as stages with fine gain adjustment are more difficult to build, requiring more area and power consumption. By re-using the fine gain stages on the AR5111 (which are required for 802.11a operation at 5 GHz anyway), the present invention avoids having to put such fine gain control stages on the AR2111.

Similarly, adjustable transmit gain is used to adjust the transmit power level. The transmit gain must be controlled accurately to one or two dB's, in order to maximize range while meeting regulatory transmit power limitations. As with the receive gain case, the finely adjustable gain stages are implemented only on the AR5111. The AR 2111 has only coarse transmit gain settings. In addition, the transmit gain control circuitry itself is preferably implemented only on the AR5111.

FIG. 2 is a circuit diagram of a detailed version of an embodiment of a dual band radio 200, having an architecture similar to that described in FIG. 1. FIG. 2 concentrates on the discrete RF circuitry at 2.4 GHz and 5 GHz, as well as the interconnections and control signals between the chipsets and RF components. Looking back to the topic of maximizing range while meeting regulatory transmit power limitations, FIG. 2 includes a set of transmit power detectors: a 5 GHz transmit power detector 204 and a 2.4 GHz transmit power detector 202. The output of both the 2.4 GHz and 5 GHz transmit power detectors on the board are routed (fed back) to the AR5111 206. The AR5111 206 adjusts its transmit gain (transmit gain control) in fine steps in response to this feedback whether the radio is transmitting at 2.4 GHz or 5 GHz. Thus, the present invention requires only one set of closed loop transmit gain control circuitry.

One of the unique aspects of a dual band transceiver 200 is the general need for separate signals to control switches and circuitry at 2.4 GHz and 5 GHz. As illustrated, two signals are used to put the radio into transmission: signal Tx2 (transmit 2.4 GHz mode) and signal Tx5 (transmit 5 GHz mode). When the radio is to transmit at 5 GHz, only Tx5 is raised. This activates only the 5 GHz PA, so that the 2.4 GHz PA does not consume power when it is not needed. In addition, Tx5 can be used to control any switches that are involved in transmitting at 5 GHz. Tx2 is the lower frequency parallel of Tx5, activating the 2.4 GHz PA and switches required for 2.4 GHz transmission while leaving the 5 GHz components powered off. Rx2 (receive 2.4 GHz mode) and Rx5 (receive 5 GHz mode) follow similarly, except powering on only the switches and LNAs needed for reception in the desired frequency band. All four of the Rx and Tx modes are preferably mutually exclusive, meaning that only one of modes Rx2, Rx5, Tx2, and Tx5 are active at any one time.

Figure 3A:
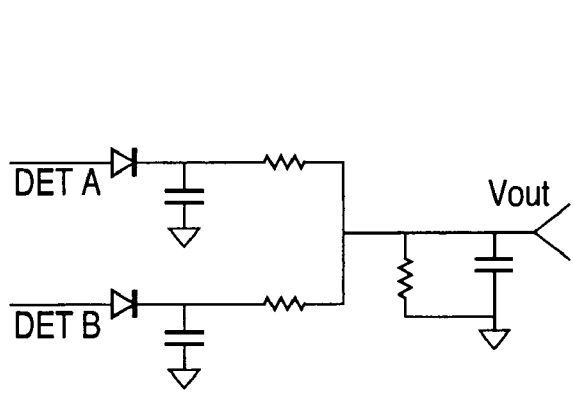
FIG. 3A is a circuit diagram of a combinatorial circuit used to combine output of two power detectors without using a switch.

Switch 208 utilizes signals Tx2 and Tx5 to connect one of the 2.4 GHz and 5 GHz transmit power detectors to AR5111 206. Turning now to FIG. 3A, there is illustrated a combinatorial circuit used to combine the output of two power detectors without using a switch. DET A and DET B each refer to a different transmit power detector circuit, each of which preferably comprises a diode, a capacitor and a resistor selected to achieve the appropriate detector response time. The DET circuits are wired together to an RC circuit. If the radio is transmitting at 5 GHz, it is presumed that the radio is not transmitting at 2.4 GHz, and therefore only one of the DET circuits is generating voltage. By connecting the outputs of the diode detectors through two resistors as shown, the single output is equal to the power detected by the active power detector.

Referring back to FIG. 2, which is illustrated as a system with two antennas (antennas 210 and 212), each of which is configured to operate at both bands (dual band antennas). The two antennas can thereby provide antenna diversity. However, there are commonly disadvantages to dual band antennas in their construction and performance. Therefore, in some instances four antennas, two at each band, might be desirable. In order to accommodate many possible configurations, four antenna control signals are provided, labeled A, B, C, and D in the diagram. These antenna control signals are preferably completely programmable in their operation; that is, for each possible state: Tx at 5 GHz, Tx at 2.4 GHz, Rx at 5 GHz, Rx at 2.4 GHz, the related modes of receive at 5 GHz while using the switches for attenuation, receive at 2.4 GHz with attenuation, and neither transmit nor receive (put switches into their minimum power state), the polarity of all four signals can be programmed by the user of the chipset.

Reception with attenuation follows the previous description of using the switches between the chips for gain control. Note that in this diagram the switches between the chips (switches corresponding to 140 and 145) are labeled ATTEN5_B and ATTEN2_B, and are independent signals. They are independent because they are used for receive gain control and therefore are not activated simply because the Rx2 and Rx5 signals are active, but as a gain control at certain points within either of the 2.4 GHz or 5 GHz operations (e.g., ATTEN5_B on switch 145 is pulled up when 5 GHz reception should not be attenuated, and switch 145 is pulled down (to a neutral position or to TxIF) when 5 GHz reception is to be attenuated).

In addition to the generalized programmability of the antenna selection signals, the present invention preferably provides programmability of all switch control signals to allow the user to specify the polarity and exact timing of the signal's transitions relative to entering or leaving transmit and reception. These switches are generally implemented with diodes and current is applied to the diode to turn the switch on. The designer decides how to implement the switch, meaning the designer may want to push current through the diode or the designer might want to pull current backwards through the diode to turn the switch on. The difference is whether the switch is turned on by putting a high voltage on the control line or the switch is turned on by putting a low voltage on the control line. Since many designers have preferences as to how this is done, the preferred embodiment of the present invention accommodates programming of the chips so that for any signal (e.g., Tx5, which indicates transmission at 5 GHz), the present invention allows programmability such that the signal is true when the signal is a high voltage, or, the signal can be true when the signal is a low voltage. The designer can thereby maintain his/her preferential design style.

The present invention provides further designer conveniences, such as adjustable signal delay times. For example, power amplifiers with different transient turn on times can be accommodated by adjusting the delay in the appropriate Tx signal. These signals can have their associated delay adjusted to occur any amount of time before the actual transmission begins.

The signal marked Hi/Lo Tune is intended to help with the wide frequency range that 5 GHz band radios must cover. The FCC has allocated 5.15-5.35 GHz, as well as 5.725-5.825 GHz for wireless LANs in the U-NII and upper ISM bands. It is difficult to control the images and LO leakage over such a wide bandwidth when using a single RF filter over the full range of frequencies. The opportunity exists to build a tunable RF filter that shifts its passband depending on which set of channels (e.g., 5.15-5.35 or 5.725-5.585) within the 5 GHz range the radio is currently operating on. Hi/Lo Tune provides this capability by allowing the user to program a frequency crossover point. The user specifies a frequency below which Hi/Lo Tune carries a low voltage, and above which it switches to a high voltage. This switching is controlled automatically on the chip given the knowledge of what channel the radio is currently tuned to. The signal can actually be used in the 2.4 GHz band, or as an extra aid for tuning a filter between the two bands.

Figure 3B:
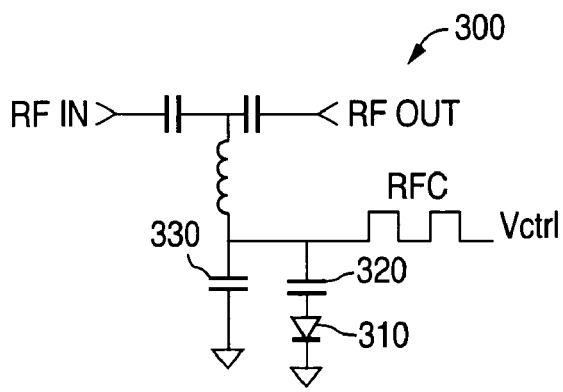
FIG. 3B is a circuit diagram of a configuration for a tunable filter according to an embodiment of the present invention.

FIG. 3B shows a circuit diagram of a configuration for a tunable filter 300. The Hi/Lo Tune signal is used to turn on or off a diode switch 310. The RFC (RF Choke) prevents HF signal energy from flowing into the Vctrl by providing an HF open circuit, but still allowing application of voltage from Vctrl. When the diode switch is turned on (via application of control voltage Vctrl), it effectively closes a circuit (that was previously open) between capacitor 320 and ground. Capacitor 320, then in parallel with capacitor 330 increases the total capacitance of the filter, which shifts the tuning of the filter.

It is desirable to accurately control the transmit power. This is required to meet regulatory requirements, provide consistent performance, and insure that the amplifier does not distort the transmit signal. This is usually accomplished with a closed loop power control system. FIG. 2 shows two off-chip transmit power detectors (202 and 204) built from discrete devices. It is advantageous to put the power detectors as near as possible to the antenna so that as much of the circuitry as possible is corrected for within the feedback loop. However, it is challenging to build power detectors that operate at two disparate frequency ranges. Generally, power detectors use directional couplers that are fundamentally narrow band frequency selective devices.

FIG. 2 shows how the outputs of two different power detectors can be switched and then provided to a single power detector input on the chip. The diagram shows the use of the Tx2 and Tx5 signals to select the state of the switch. These signals are ideal for this purpose since the power detector only needs to be observed during transmission and they automatically cause the correct power detector to be chosen.

There are a number of arrangements of the RF front end switches, filters, and diplexers that are advantageous. In particular four different arrangements are shown in FIGS. 2, 5, 6, and 7, each providing different optimizations. FIG. 2 shows the circuit arrangement that requires a minimal number of RF filters and no diplexers. This approach is advantageous in terms of circuit board area as filters and diplexers generally require significant area on a PC board. In addition, this approach has a minimal number of elements between the antenna and the PAs and LNAs. Therefore this approach may provide the lowest loss RF path and therefore the highest transmit power and greatest receive sensitivity.

The key to this approach can be described by following the signal path from the antenna back towards the LNAs/PAs. The antenna connects to a "bridge switch" 216 that acts as both an antenna diversity switch and 2.4 GHz/5 GHz band switch. The antenna diversity switching function allows the selection of one of at least two antennas to receive or transmit the signal. The two antennas differ in their location or orientation. By being able to switch to any of the antennas, the odds of successful reception are increased. The bridge switch is connected to the RF filters (separate for 2.4 GHz (218) and 5 GHz (214)), which are in turn connected to two transmit/receive switches 220 (Tx/Rx 5 GHz) and 222 (Tx/Rx 2.4 GHz), one for each frequency band. The Tx/Rx switches connect to the corresponding 2.4 GHz and 5 GHz PAs and LNAs (224-230).

Figure 4A:
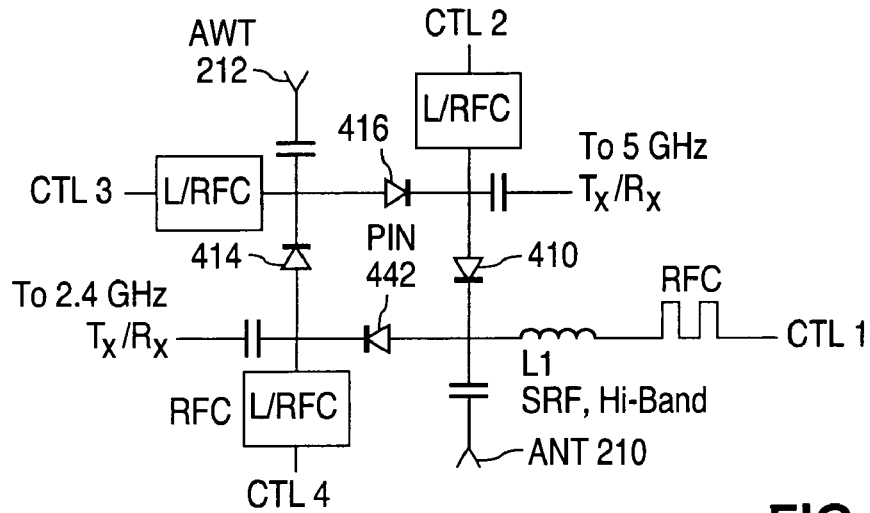
FIG. 4A is a circuit diagram of a "bridge switch" according to an embodiment of the present invention.
Figure 4B:
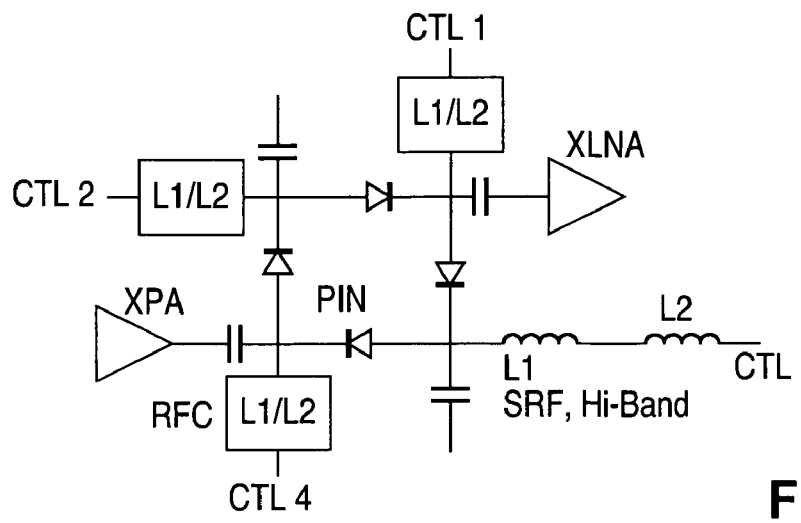
FIG. 4B is a circuit diagram of a "bridge switch" according to an embodiment of the present invention.

FIGS. 4A and 4B show two detailed circuit implementations of a "bridge switch" for use with the present invention. The examples shown here are very unique in that they are built using diodes, and operate in both frequency bands. In order to operate in the two widely separated frequency bands, the DC control voltages that switch the diodes on and off must be isolated from the RF signal at both frequencies. FIG. 4A uses an inductor L1, ideally self-resonant at the higher frequency band, connected by a ~¼ wave transmission line to an AC ground (e.g., RFC to CTL2), the length of this trace is adjusted to give high impedance at the lower frequency band. The second approach, shown in FIG. 4B, uses two inductors, the first ideally self resonant at the higher frequency band, and the second with its value chosen to provide a net high impedance considering both elements in the lower frequency band.

In FIG. 4A, the arrangement of inductor L1 and the ~¼ wavelength transmission line are repeated in each corner of the "bridge switch" at the boxes labeled "L/RFC." The switch operates by turning on a selected diode that then connects an antenna (one of antenna 212 and antenna 210) to one of the 5 GHz circuitry (e.g., 5 GHz Tx/Rx switch) and 2.4 GHz circuitry. For example, to connect antenna 210 to the 5 GHz circuitry, diode 410 must be forward biased so that it is turned on. Forward biasing diode 410 comprises setting a voltage at control 2 at a level appropriate for sufficient current (via a resistor) to turn the diode on, and setting a voltage at control 1 (CTL1) at a relatively low voltage or ground, thus making a connection between antenna 210 and the 5 GHz circuitry. Similarly, by setting various combinations of the control signals CTL1, CTL2, CTL3, and CTL4, either of the antennas 210 or 212 may be connected to either of the 2.4 or 5 GHz circuitry. Table 2 provides a logic chart that indicates the control signals preferred to activate the lines illustrated in the bridge switch 216 of FIG. 2.

TABLE 2

|   | CTL 1 | CTL 2 | CTL 3 | CTL 4 |
|---|-------|-------|-------|-------|
| A | 1 | 0 | 1 | 0 |
| B | 0 | 1 | 0 | 1 |
| C | 1 | 0 | 1 | 0 |
| D | 0 | 1 | 0 | 1 |

On bridge switch 216 of FIG. 2, it can be observed that control line A is utilized to connect antenna 210 to the 2.4 GHz circuitry. Similarly, control line B is used to connect the antenna 210 to the 5 GHz circuitry. Switches D and C perform those same functions for antenna 212. In Table 2, signal A is activated by logic levels 1 and 0 applied to CTL1 and CTL4 respectively (logic level 1 comprising a relatively high voltage and logic level 0 comprising a relatively low voltage or ground). Similarly, control signals for B, C, and D are also shown in Table 2.

In the construction of a dual band bridge switch, configuration 1, as shown in FIG. 4A, the combination of inductor L1 and RFC choke supports the dual band nature of the switch. The combination L1 and RFC are configured such that the inductor blocks signals at 5 GHz, and the combination of the inductor and RFC blocks signals at 2.4 GHz. The L1/RFC combination prevents signals that are to be broadcast to or received from either of the antennas, from leaving the circuit through the control (CTL) lines. And, the control (CTL) lines still have access to apply a proper voltage to any one of the diodes (for biasing) in order to make the connections discussed above.

Turning now to FIG. 4B which is a circuit diagram that illustrates a dual band switch of a second configuration, the impedance needed to prevent signal loss through the CTL is implemented in the combination of two inductors L1 and L2. L1 is an inductor that has a high impedance at 5 GHz, and the combination of inductor L1 and L2 has a high impedance at 2.4 GHz. The dual band switches of FIGS. 4A and 4B may be modified for use in a single band implementation by simply providing one inductor having a high impedance at the single band frequency.

Figure 5:
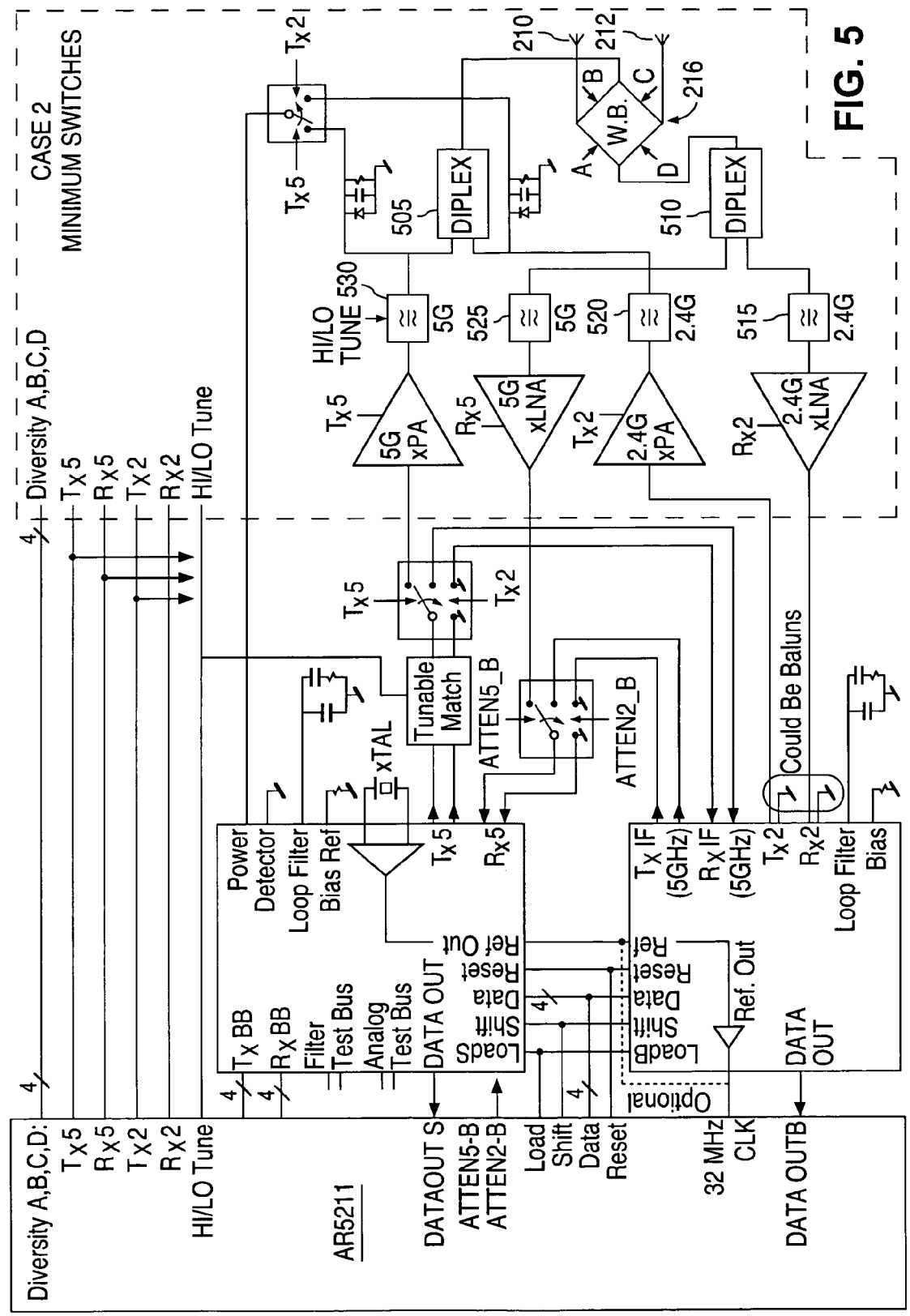
FIG. 5 is a circuit diagram of an arrangement of filters and diplexers configured for a reduced number of switches according to an embodiment of the present invention.

FIG. 5 shows an arrangement of switches, filters, and diplexers that is optimum for reducing the number of switches in a dual band radio implementation. Because switches are generally built of diodes or GaAs FETs at these frequencies, they tend to be expensive. Therefore, by minimizing the number of switches, the cost of the implementation can be minimized. The key to the topology in FIG. 5 is to connect the antennas to the bridge switch 216 so that it acts as both an antenna diversity and transmit receive (Tx/Rx) switch. The bridge switch 216 is connected to diplexers 505 and 510, which effectively replaces any of the band switches shown in the other approaches. The diplexers themselves may provide sufficient RF filtering, or they may be connected to additional RF filtering (e.g., filters 515-530) as shown in FIG. 5. However, preferably, the additional RF filtering is not used.

Figure 6:
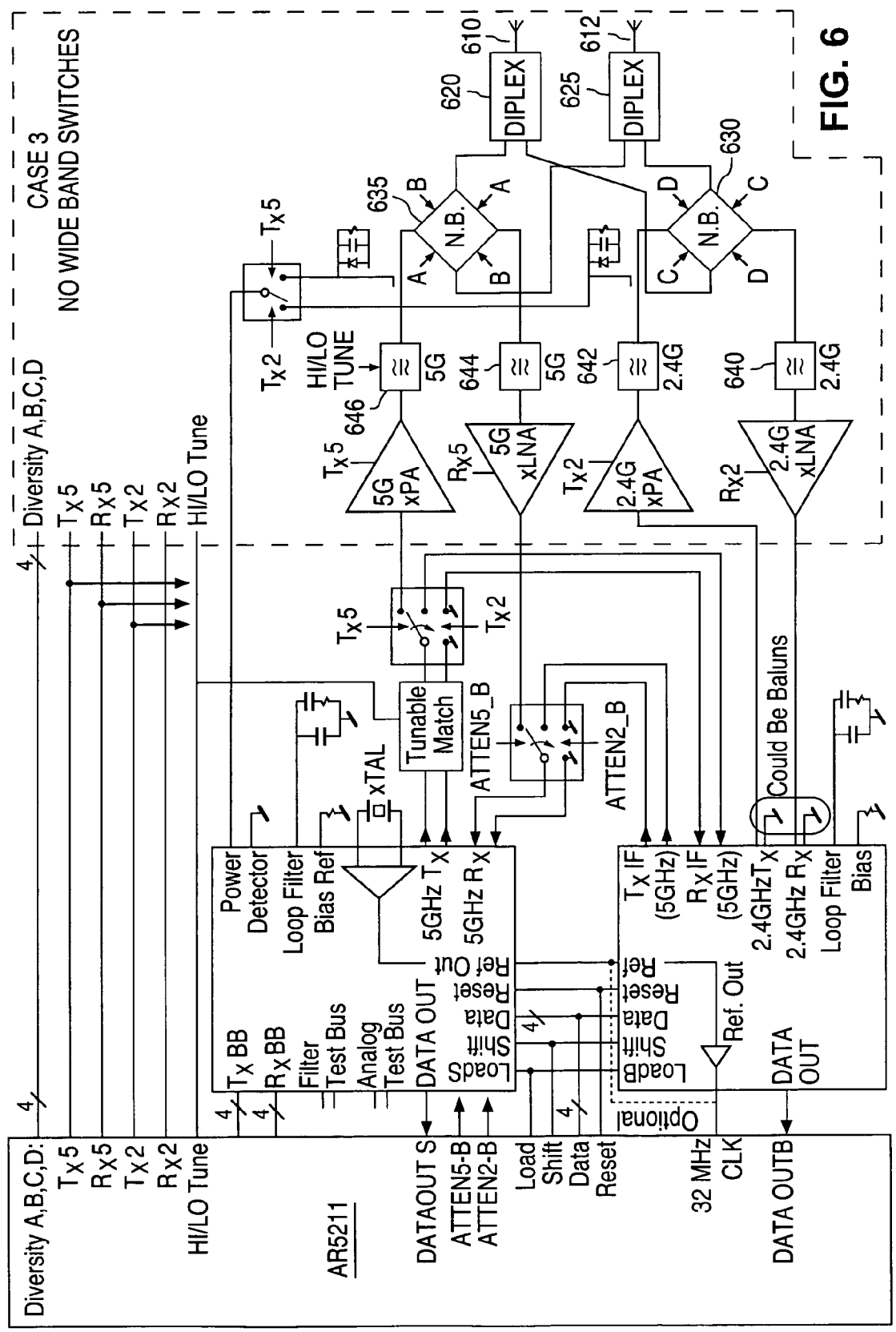
FIG. 6 is a circuit diagram of an arrangement of RF filters and diplexers that does not require any wideband switches according to an embodiment of the present invention.

FIG. 4 and FIG. 5 both require dual band switches (implemented as a bridge switch in these embodiments). In both cases the bridge switch carries both 2.4 and 5 GHz signals (a wideband switch). Carrying different frequency bands can present performance issues (e.g., signal loss) when attempting to construct the bridge switch. FIG. 6 shows a third arrangement of switches, RF filters, and diplexers that does not require any wideband switches. By connecting the antennas 610 and 613 first to diplexers 620 and 625, the two frequency bands are immediately separated. Bridge switches 630 and 635 are then connected to the corresponding single frequency band outputs of each diplexer. Therefore, each bridge switch carries signals in only one frequency band. As before, the diplexers themselves may provide sufficient RF filtering. If not, additional RF filtering 640-646 is connected to the bridge switch as shown in FIG. 6, or placed between the bridge switch and the diplexer (Again, marks indicate that the illustrated component is optional depending on design preferences).

All of the topologies discussed thus far have depended on having two dual band antennas for diversity. However, single band antennas may provide higher performance. With single band antennas, four antennas are used to provide antenna diversity in both bands. FIG. 7 shows an example in which the bridge switch is replaced with four independent switches 702-708. The independent switches may utilize the same four-antenna switching signals to connect a selected antenna to currently active 5 GHz or 2.4 GHz circuitry. Note that in this case the switches only need to pass a single frequency band. In another variation, four antennas can be accommodated based on FIG. 6 by eliminating the diplexer and connecting the four antennas directly to a corresponding connection of the bridge switches.

In each of FIGS. 2, 5, 6, and 7, a control device AR5211 is illustrated. The control device includes a processor or a state machine programmed to provide the various control signals needed to operate the switches and other functions described herein. For example, the control device provides the Tx and Rx signals for each of the 5 GHz and 2.4 GHz signals, the Hi/Lo tune signal, antenna switching signals AB, C, D, attenuation signals (for the switch attenuation functions described above), and various reference clocks as needed. The control device shown is a specific arrangement of control lines utilized in several of the embodiments of the invention described herein. It should be understood that, based on the present disclosure, many other arrangements of control devices, control signals, and other parts may be utilized, including apportioning various functions differently between the devices illustrated, and/or combining components and/or other functionality into other integrated circuits or discrete components.

Furthermore, it should also be understood that although the present invention has been described as a dual band radio with both transmit and receive capabilities, the devices and processes described herein may be utilized in a receive-only or a transmit-only dual band device. And, although the present invention has been mainly described as a dual band radio operating in the 5 GHz and 2.4 GHz frequency bands, the embodiments shown may also be applied to other frequency bands. Similarly, while most of the description has focused on the higher frequency (5 GHz) device as being the primary device, the frequency bands of the two devices could be reversed such that the primary device is at the lower frequency. Although the present invention is preferred to be utilized in a WLAN device (either a client or a base station/AP device) these same devices and processes may be applied to other types of wireless devices. And, the present invention is preferably utilized in IEEE 802.11a, IEEE 802.11b, implementations, but other formats of RF transmissions, or modulation schemes may also be similarly accommodated. For example, IEEE 802.11g (OFDM at 2.4 GHz), among others, may also be utilized. In an example implementation, the control device (e.g., AR5211) performs the signal modulation and passes the modulated signal to the radio device(s) for conversion(s) to their operational broadcast frequencies.

In describing preferred embodiments of the present invention illustrated in the drawings, specific terminology is employed for the sake of clarity. However, the present invention is not intended to be limited to the specific terminology so selected, and it is to be understood that each specific element includes all technical equivalents, which operate in a similar manner. For example, when describing a bridge switch using diodes with impedances that prevent signal loss through control lines, any other equivalent device, such as transistor based switching, or any other device having an equivalent function or capability, whether or not listed herein, may be substituted therewith. Furthermore, the inventors recognize that newly developed technologies not now known may also be substituted for the described parts and still not depart from the scope of the present invention. All other described items, including, but not limited to tunable filters, frequency conversion mechanisms, antenna arrangements, transmit power detectors, transmit power adjustments, signal attenuation devices and techniques, and overall system architecture, etc. should also be consider in light of any and all available equivalents.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art based on the present disclosure.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, recognition and analysis of signal characteristics, including signal strength, setting attenuation levels, adjusting LO frequencies, setting tunable filters, setting diversity switches, switching frequency paths, Tx/Rx switching, etc. as described herein.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A wireless LAN device having a dual band capability comprising:
   a primary transceiver including a first RF communication device; and
   a secondary transceiver including a partial RF communication device that utilizes features of the primary transceiver to be able to perform as a second RF communication device,
   wherein a fine step frequency control is implemented solely on the primary transceiver and a coarse step frequency control is implemented solely on the secondary transceiver.

2. The wireless LAN device according to claim 1, wherein the secondary transceiver uses both the coarse frequency steps of the secondary transceiver and the fine frequency steps of the primary transceiver to produce an operational frequency of the secondary transceiver.

3. The wireless LAN device according to claim 1, wherein said coarse frequency steps comprise frequency steps in a Local Oscillator (LO) of the secondary transceiver of 3.168 GHz and 3.136 GHz.

4. The wireless LAN device according to claim 1, wherein said fine frequency steps comprise frequency steps in a Local Oscillator (LO) of the primary transceiver of 5.58 GHz to 5.64 GHz in 5 MHz steps.

5. The wireless LAN device according to claim 1, wherein said fine frequency steps comprise frequency steps in a Local Oscillator (LO) of the primary transceiver of 5.58 GHz to 5.64 GHz in 5 MHz steps, and 5.620 GHz.

6. The wireless LAN device according to claim 1, wherein said fine frequency steps comprise frequency steps in a Local Oscillator (LO) including a set of evenly spaced steps and at least one non-evenly spaced step.

7. The wireless LAN according to claim 6, wherein said at least one non-evenly spaced step is 5.620 GHz.

8. A wireless LAN device having a dual band capability comprising:
- a primary transceiver including a first RF communication device and a fine step frequency control; and
- a secondary transceiver including a partial RF communication device that utilizes features of the primary transceiver to be able to perform as a second RF communication device,
- wherein the secondary transceiver uses a fixed frequency signal and a tuned frequency of the primary transceiver to create an operational frequency signal of the secondary transceiver.

9. A wireless LAN device having a dual band capability comprising:
- a primary transceiver including a first RF communication device;
- a secondary transceiver including a partial RF communication device that utilizes features of the primary transceiver to be able to perform as a second RF communication device,
- wherein a fine step gain control mechanism is implemented solely on the primary transceiver and a coarse step gain control mechanism is implemented solely on the secondary transceiver.

10. The wireless LAN device according to claim 9, further comprising a feedback loop that adjusts the fine step gain control based on a signal strength of a signal transmitted from the wireless LAN device.

11. A wireless LAN device having a dual band RF capability comprising:
- a primary transceiver including a first RF communication device; and
- a secondary transceiver including a partial RF communication device that utilizes features of the primary transceiver to be able to perform as a second RF communication device;
- at least two antennas and an antenna switch configured to select at least one of the antennas to operate with a currently active one of the primary transceiver and the secondary transceiver;
- a tunable Hi/Lo filter coupled between the antennas and a front end of the primary transceiver; and
- a control device that recognizes a channel currently tuned to by the primary transceiver and sends a signal to the tunable Hi/Lo filter to tune it to a pass band such that the channel of the primary transceiver is passed by the tunable filter.

12. The wireless device according to claim 11, wherein said tunable filter is a filter having an adjustable capacitance value that tunes the pass band of the filter.

13. The wireless LAN device according to claim 12, wherein the adjustable capacitance comprises a set of at least two parallel capacitors, at least one of said capacitors being isolated from the tunable filter via a switchable diode.

14. The wireless LAN device according to claim 13, wherein the switchable diode comprises a control voltage isolated from HF signals and configured to bias the diode so that the isolated capacitor becomes part of the filter tuning.

15. The wireless device according to claim 14, wherein said control voltage isolation is performed via an RF choke.

16. The wireless device according to claim 11, wherein said control device is user programmable as to a switching point between high and low settings of the Hi/Lo tunable filter.

17. The wireless LAN device according to claim 16, wherein said switching point is a frequency between bands within an overall frequency range of the primary transceiver.

18. The wireless LAN device according to claim 16, wherein said switching point is above 2.4 GHz and below 5.15 GHz.

19. A device, comprising:
- a wireless LAN device;
- a primary transceiver coupled to the wireless LAN device; and
- a secondary transceiver coupled to the wireless LAN device,
- wherein the primary transceiver includes a first RF communication device and a fine step frequency control mechanism implemented solely on the primary transceiver,
- wherein the secondary transceiver includes a partial RF communication device that utilizes features of the primary transceiver to be able to perform as a second RF communication device and a coarse step frequency control mechanism implemented solely on the secondary transceiver.

20. The device according to claim 19, wherein a transmit gain control of the wireless LAN device is performed by the primary transceiver.

21. The device according to claim 19, wherein a receive gain control of the wireless LAN device is performed by the primary transceiver.

22. The device according to claim 19, further comprising a feedback loop that adjusts the fine step frequency control based on a signal strength of a signal transmitted from the wireless LAN device.

23. The device according to claim 19, wherein the secondary transceiver comprises a conversion module coupled between the primary transceiver and antennas used by the secondary transceiver.

24. The device according to claim 19, wherein the primary transceiver has a more direct signal path to antennas than the secondary transceiver.

25. The device according to claim 24, wherein the primary transceiver operates at a higher frequency band than the secondary transceiver.

26. The device according to claim 19, wherein the wireless LAN device is fully operational at a frequency range of the primary transceiver when the secondary transceiver is removed from the wireless LAN device.

27. The device according to claim 19, wherein the wireless LAN device is fully operational at a frequency range of the primary transceiver when the secondary transceiver is removed from the wireless LAN device.

28. The device according to claim 19, wherein the primary transceiver is a first integrated chip set and the secondary transceiver is a second integrated chip set, and the wireless LAN device is fully operational at a frequency range of the primary transceiver when the second integrated chip set is removed from the wireless LAN device without any other modifications to the wireless LAN device.

29. The device according to claim 28, wherein transmit gain control is performed in the first integrated chip set.

30. The device according to claim 28, wherein receive gain control is performed in the second integrated chip set.

31. The device according to claim 19, wherein the primary transceiver produces communication signals in a first frequency band, and the secondary transceiver converts the first frequency band communication signals to a second frequency band.

32. The device according to claim 31, wherein the conversion performed by the secondary transceiver is less precise than a resolution of the communication signals produced by the primary transceiver.

33. The device according to claim 19, wherein operations performed by the secondary transceiver are less precise than operations performed by the primary transceiver.

34. The device according to claim 19, further comprising a band selection switch configured to route signals to/from the primary transceiver from/to one of at least one antenna and the secondary transceiver.

35. The device according to claim 34, wherein the band selection switch comprises a three position switch wherein the first position implements a connection between the primary transceiver and said at least one antenna, the second position implements a connection between the primary transceiver and the secondary transceiver, and the third position is a neutral open circuit position.

36. The device according to claim 35, wherein the third neutral open circuit position allows signals to leak from one of said at least one antenna and the secondary transceiver to the primary transceiver when the wireless LAN device is receiving signals.

37. The device according to claim 36, further comprising a control device configured to set the three position switch to, the first position when the wireless LAN device is transmitting or receiving on the frequency band of the primary transmitter, the second position when the wireless LAN device is transmitting or receiving on the frequency band of the secondary transmitter, and the third position when incoming signals being received are too large for proper processing in the primary transceiver.

38. The device according to claim 36, further comprising a control device configured to set the three position switch to the third position when incoming signals being received need to be reduced in signal size for proper processing in the primary transceiver.

39. The device according to claim 36, further comprising a control device configured to set the three position switch to the third position when incoming signals being received would otherwise saturate at least one component of the primary transceiver.

40. The device according to claim 39, wherein said at least one component is an Analog to Digital Conversion (ADC) device in a baseband portion of the primary transceiver.

41. The device according to claim 36, wherein the third switch position operates as a signal attenuation device.

42. The device according to claim 36, wherein the switch is chosen so that the amount of leakage comprises a 5-15 dB received signal strength reduction at the primary transceiver.

43. The device according to claim 36, further comprising a control device configured to set the three position switch to the second position when incoming signals being received on a frequency band of the primary transceiver would otherwise saturate at least one component of the primary transceiver.

44. The device according to claim 36, further comprising a control device configured to set position 3 if an incoming signal is in a first predetermined signal strength range, and set position 2 if an incoming signal is within a second predetermined signal strength range, said first and second predetermined signal strength ranges are selected so that the incoming signal, after signal attenuation from the switch position and any other attenuation in the signal path, is properly sized for receiving components of the primary transceiver.

45. The device according to claim 44, wherein said receiving components include at least an Analog to Digital Converter (ADC).

46. The device according to claim 19, wherein said primary and secondary transceivers operate at frequencies disparate enough so that off-chip filtering is not required.

47. The device according to claim 19, wherein said primary and secondary transceivers are implemented in chip sets including enough on chip filtering such that no signal interference occurs between different frequency bands of the primary and secondary transceiver.

48. The device according to claim 19, wherein each of the primary and second transceivers include a Local Oscillator for producing mixing frequencies for production of operational frequencies of each respective transceiver.

49. The device according to claim 48, wherein the primary transceiver LO and the secondary transceiver LO share a same reference frequency.

50. The device according to claim 49, wherein said reference frequency is 32 MHz.

51. The device according to claim 50, wherein the mixing frequencies of the primary LO comprises 5.58 GHz to 5.64 GHz in 5 MHz steps, and at least one out-of-step frequency.

52. The device according to claim 51, wherein the out of step frequency is 5.62 GHz.

53. The device according to claim 49, wherein the mixing frequencies of the secondary LO comprises 3.168 GHz and a set of at least one coarse step frequency.

54. The device according to claim 53, wherein said at least one coarse step frequency is 3.136 GHz.

55. The device according to claim 19, further comprising:
a transmit switch coupled to an RF output of the primary transceiver and configured to route signals from the primary transceiver to one of an IF input of the secondary transceiver and a front end of the wireless LAN device; and
a receive switch coupled to an RF input of the primary transceiver and configured to route signals from one of an IF output of the secondary transceiver and a front end of the primary transceiver to an RF input of the primary transceiver.

56. The device according to claim 55, wherein said front end comprises a primary power amplifier for amplification of signals for transmission directly from the primary transceiver, a primary low noise amplifier for reception of signals to be directly received by the primary transceiver, a secondary power amplifier for amplification of signals for transmission from the secondary transceiver, and a secondary low noise amplifier for amplification of reception signals to be received by the secondary transceiver.

57. The device according to claim 56, further comprising:
a control device configured to produce one of Tx primary, Rx primary, Tx secondary and Rx secondary control signals;
wherein the produced control signal enables the front end amplifier corresponding to the control signal, and, sets at least one of the transmit and receive switches to make an appropriate signal path from the enabled amplifier to one of the primary and secondary transceivers.

58. The device according to claim 57, wherein said control device is programmable as to timing of the Rx and Tx control signals.

59. The device according to claim 57, wherein said control device is programmable as to a polarity of the Rx and Tx control signals.

60. The device according to claim 19, further comprising at least two antennas, and an antenna switch configured to select at least one of the antennas to operate with a currently active one of the primary transceiver and the secondary transceiver.

61. The device according to claim 60, wherein the antenna switch comprises a diode bridge switch including control feeds with high impedance at operational frequencies of both the primary and secondary transceivers.

62. The device according to claim 60, wherein said operational frequencies are the 2.4 GHz frequency band, and the 5 GHz frequency band.

63. The device according to claim 61, wherein at least one of the control feeds is an inductor and a printed transmission line.

64. The device according to claim 61, wherein at least one of the control feeds is two series inductors.

65. The device according to claim 60, wherein said antennas are dual band antennas.

66. The device according to claim 65, wherein said dual band antennas are configured to operate in the 2.4 GHz and 5 GHz frequency bands.

67. The device according to claim 60, wherein said antenna switch is a user configurable matrix.

68. The device according to claim 60, further comprising a tunable Hi/Lo filter coupled between the antennas and a front end of the primary transceiver.

69. The device according to claim 19, further comprising a primary transceiver transmit signal strength detector and a secondary transmit signal strength detector;
a signal strength adjustment mechanism configured to adjust transmission power of the primary transceiver based on the transmit signal strength detected.

70. The device according 69, further comprising a detection selection switch configured to select the primary signal strength detector for detecting transmit signal strength when the primary transceiver is transmitting and to select the secondary signal strength detector for detecting transmit signal power when the secondary transceiver is transmitting.

71. The device according to claim 19, wherein the wireless LAN device operates without diplexers.

72. The device according to claim 19, further comprising:
an antenna port including an antenna switch configured to select at least one of a set of diversity antennas;
a primary Tx/Rx switch having a first switch position configured to connect signals transmitted from the primary transceiver to the antenna port and a second switch position to connect signals received from the antenna port to the primary transceiver; and
a secondary Tx/Rx switch having a first switch position configured to connect signals transmitted from the secondary transceiver to the antenna port and a second switch position to connect signals received from the antenna port to the secondary transceiver.

73. The device according to claim 72, further comprising a control device configured to identify a frequency $F_{RX}$ of a signal being transmitted or received by the wireless LAN device and to set the antenna switch and the Tx/Rx switches so that a signal path corresponds to the frequency $F_{RX}$ and a Tx/Rx nature of the signal being transmitted or received.

74. The device according to claim 72, wherein the antenna switch comprises a diode bridge switch including control feeds with high impedance at frequency bands utilized by both of the primary and secondary transceivers.

75. The device according to claim 74, wherein said frequency bands are the 2.4 GHz frequency band, and the 5 GHz frequency band.

76. The device according to claim 74, wherein at least one of the control feeds is an inductor and a printed transmission line.

77. The device according to claim 74, wherein at least one of the control feeds is two series inductors.

78. The device according to claim 19, wherein the wireless LAN device operates with a fewest number of switches in transmit and receive chains of at least one of the transceivers.

79. The device according to claim 78, further comprising:
an antenna port including an antenna switch configured to select at least one of a set of diversity antennas;
a combinatorial diplexer coupled to the antenna port and configured to collect transmitted signals from the primary transceiver and transmitted signal from the secondary transceiver and forward the collected signals to the antenna port;
a splitting diplexer coupled to the antenna port and configured to split signals received by the antenna port based on frequency into a first set of signal frequencies that are forwarded to the primary transceiver and a second set of signal frequencies forwarded to the secondary transceiver.

80. The wireless LAN device according to claim 79, wherein the antenna switch comprises a diode bridge switch including control feeds with high impedance at frequency bands utilized by both the primary and secondary transceivers.

81. The device according to claim 80, wherein said frequency bands are the 2.4 GHz frequency band and the 5 GHz frequency band.

82. The device according to claim 80, wherein at least one of the control feeds is an inductor and a printed transmission line.

83. The device according to claim 80, wherein at least one of the control feeds is a set of series inductors.

84. The device according to claim 78, further comprising:
at least two antenna ports;
a diplexer coupled to each antenna port;
wherein each diplexer is configured to split a first band of signals received from the antenna port onto a first band line, split a second band of signals received from the antenna port onto a second band line, and retrieve transmitted signals on either of the first and second band lines and forward them to the antenna port.

85. The device according to claim 84, further comprising:
a primary single band switch configured to connect one of the first band lines from the diplexers to one of a transmit and receive part of the primary transceiver; and
a secondary single band switch configured to connect one of the second band lines from the diplexers to one of a transmit and receive part of the secondary transceiver.

86. The device according to claim 85, wherein each single band switch comprises a diode bridge switch including control feeds with high impedance at the single band frequency of the connected transceiver.

87. The device according to claim 85, wherein the transmit and receive parts of the primary transceiver comprise a Power Amplifier (PA) and a Low Noise Amplifier (LNA) of a front end of the primary transceiver.

88. The device according to claim 85, wherein the transmit and receive parts of the secondary transceiver comprise a Power Amplifier (PA) and a Low Noise Amplifier (LNA) of a front end of the secondary transceiver.

89. The device according to claim 19, wherein the wireless LAN device is constructed without any wideband switches.

90. The device according to claim 19, wherein said wireless LAN device is constructed to be used with a set of single band diversity antennas.

91. The device according to claim 19, further comprising:
a primary antenna port including connections for at least two antennas; and
an antenna switch connected to the primary antenna port and configured to connect one of the connections to a primary band line coupled to the primary transceiver.

92. The device according to claim 91, further comprising a Tx/Rx switch configured to direct the primary band line to one of a PA device of the primary transceiver and an LNA device of the primary transceiver.

93. The device according to claim 19, further comprising:
a secondary antenna port including connections for at least two antennas; and
an antenna switch connected to the secondary antenna port and configured to connect one of the antenna connections to a secondary band line coupled to the secondary transceiver.

94. The device according to claim 93, further comprising a secondary Tx/Rx switch configured to direct the secondary band line to one of a PA device of the secondary transceiver and an LNA device of the secondary transceiver.

* * * * *